United States Patent
Nako et al.

(10) Patent No.: US 6,720,847 B2
(45) Date of Patent: Apr. 13, 2004

(54) LONGITUDINALLY-COUPLED RESONATOR SURFACE ACOUSTIC WAVE FILTER AND COMMUNICATION APPARATUS USING THE SAME

(75) Inventors: Katsuhiro Nako, Kyoto (JP); Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/170,154

(22) Filed: Jun. 12, 2002

(65) Prior Publication Data

US 2002/0196104 A1 Dec. 26, 2002

(30) Foreign Application Priority Data

Jun. 12, 2001 (JP) .......................... 2001-177423
Apr. 15, 2002 (JP) .......................... 2002-112263

(51) Int. Cl.$^7$ ............................... H03H 9/64
(52) U.S. Cl. ............. 333/193; 310/313 B; 310/313 C; 333/194; 333/195; 333/196
(58) Field of Search ............... 333/193, 194, 333/196, 195, 313 A; 310/313 B, 313 C, 313 D

(56) References Cited

U.S. PATENT DOCUMENTS

| | | | | |
|---|---|---|---|---|
| 4,623,855 A | * | 11/1986 | Bulst | 333/195 |
| 4,760,360 A | * | 7/1988 | Grassl et al. | 333/195 |
| 5,115,216 A | * | 5/1992 | Hikita et al. | 333/195 |
| 5,392,013 A | * | 2/1995 | Yamamoto et al. | 333/195 |
| 5,508,667 A | * | 4/1996 | Kondratiev et al. | 333/195 |
| 5,581,141 A | * | 12/1996 | Yamada et al. | 333/195 |
| 5,818,310 A | * | 10/1998 | Solie | 333/196 |
| 5,831,492 A | * | 11/1998 | Solie | 333/195 |
| 5,932,950 A | * | 8/1999 | Yamada et al. | 333/195 |
| 6,218,763 B1 | * | 4/2001 | Fujimoto et al. | 310/313 R |
| 6,310,524 B1 | * | 10/2001 | Ago et al. | 333/194 |
| 6,404,101 B1 | * | 6/2002 | Taniguchi et al. | 310/313 A |
| 6,476,691 B1 | * | 11/2002 | Tsuzuki et al. | 333/193 |
| 6,501,208 B1 | * | 12/2002 | Kuroda | 333/195 |
| 6,556,100 B2 | * | 4/2003 | Takamine | 333/195 |

FOREIGN PATENT DOCUMENTS

JP  05-267990  10/1993
JP  10-126212  5/1998

* cited by examiner

*Primary Examiner*—Michael Tokar
*Assistant Examiner*—Lam Mia
(74) *Attorney, Agent, or Firm*—Keating & Bennett, LLP

(57) ABSTRACT

A longitudinally-coupled resonator surface acoustic wave (SAW) filter includes a piezoelectric substrate and at least two IDTs arranged in the direction along which a SAW propagates on the piezoelectric substrate. At least one of the IDTs has an electrode finger wherein the metallization ratio of the electrode finger is different from that of the other electrode fingers of the IDT.

20 Claims, 11 Drawing Sheets

LONGITUDINALLY-COUPLED RESONATOR SURFACE ACOUSTIC WAVE FILTER AND COMMUNICATION APPARATUS USING THE SAME

BACKGROUND OF THE INVENTION

1. Field of the Invention

The present invention relates to a longitudinally-coupled resonator surface acoustic wave (SAW) filter and to a communication apparatus including the same.

2. Description of the Related Art

In recent years, communication apparatuses such as mobile phones often have a transmission frequency band and a reception frequency band, which are near each other, due to increased users and diversification of services. Some communication apparatuses require attenuation that is larger than a predetermined level quite near the passband thereof for preventing interference of other communication apparatuses. Accordingly, SAW filters widely used as a band-pass filter for an RF stage of a mobile phone require larger attenuation than the predetermined level quite near the passband.

For the SAW filters, a function of balance/unbalance signal conversion, which is a so-called balun function, becomes increasingly required in order to reduce the number of parts used. For example, a longitudinally-coupled resonator SAW filter having the function of balance/unbalance signal conversion is disclosed in Japanese Unexamined Patent Application Publication No. 5-267990.

However, when using the known longitudinally-coupled resonator SAW filter described above, a deterioration of the shoulder characteristic, which is called a transversal response (a deterioration of the steepness of frequencies), is seen at the higher frequency-side of the passband. Subsequently, the known longitudinally-coupled resonator SAW filter cannot achieve sufficient attenuation at the higher frequency-side of the passband, which is required for a communication apparatus in the personal communication system (PCS).

For solving such problems, a ladder-type SAW filter is disclosed in Japanese Unexamined Patent Application Publication No. 10-126212, for example. This filter has large attenuation at the higher frequency-side of the passband. However, this ladder-type SAW filter cannot have the function of balance/unbalance signal conversion. That is to say, it is difficult for the known SAW filter to achieve sufficient attenuation at the higher frequency-side of the passband and the function of balance/unbalance signal conversion.

SUMMARY OF THE INVENTION

In order to overcome the problems described above, preferred embodiments of the present invention provide a longitudinally-coupled resonator SAW filter which substantially reduces the transversal response compared to the known SAW filter, and which has the function of balance/unbalance signal conversion.

According to a preferred embodiment of the present invention, a longitudinally-coupled resonator surface acoustic wave (SAW) filter includes a piezoelectric substrate and at least two interdigital transducers (IDTs) provided on the piezoelectric substrate along the direction in which a surface acoustic wave propagates. At least one of the IDTs has an electrode finger wherein the metallization ratio of the electrode finger is different from that of other electrode fingers of the IDT.

Preferably, in the longitudinally-coupled resonator SAW filter, at least one of the adjacent IDTs has an electrode finger at a region extending from the adjacent portion of the IDT to an about one-fourth portion of the IDT. The metallization ratio of the electrode finger is preferably different from that of other electrode fingers of the IDT.

Preferably, in the longitudinally-coupled resonator SAW filter, at least one of the IDTs has electrode fingers wherein the metallization ratio of the electrode fingers is continuously varied in the direction along which a surface acoustic wave propagates.

As a result of this unique construction, the longitudinally-coupled resonator SAW filter has reduced transversal response and a large attenuation at the higher frequency-side of the passband. Further, by forming the portion wherein the metallization of the electrode fingers is continuously varied in the direction along which a SAW propagates in the region from the adjacent portion of the IDT to the about one-fourth portion of the IDT, the insertion loss in the passband is not increased. Further, by continuously varying the metallization ratio of the electrode fingers in the surface acoustic propagation direction, the insertion loss within the passband is not increased and a better effect of the present invention can be obtained.

According to another preferred embodiment of the present invention, a communication apparatus includes the longitudinally-coupled resonator SAW filter according to preferred embodiments described above mounted therein. By using the longitudinally-coupled resonator SAW filter of the other preferred embodiments of the present invention, the communication apparatus achieves excellent communication quality and high reliability.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A longitudinally-coupled resonator surface acoustic wave (SAW) filter according to embodiments of the present invention will now be described with reference to FIGS. 1A, 1B, 2 to 12.

Figure 1A:
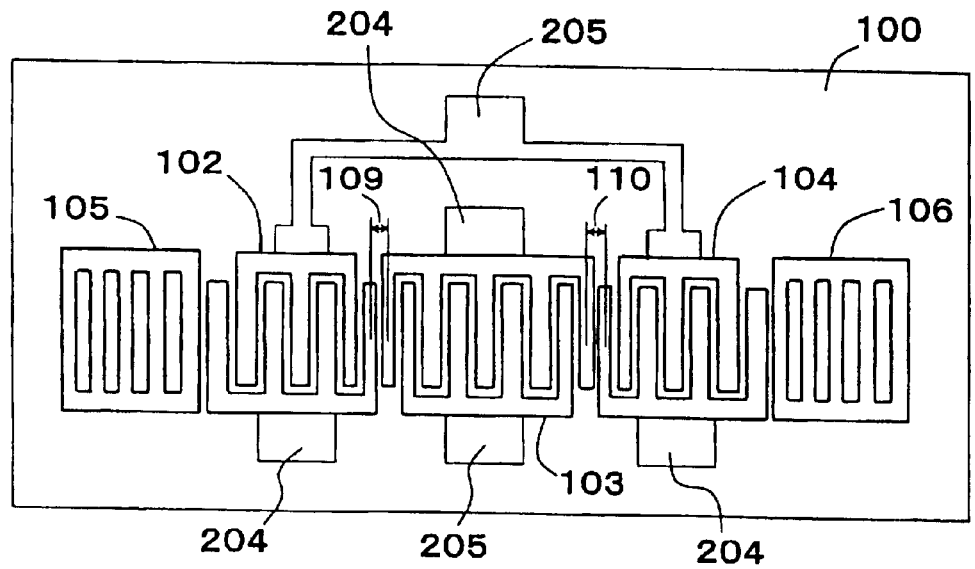
FIG. 1A schematically shows a longitudinally-coupled resonator surface acoustic wave (SAW) filter according to a first preferred embodiment of the present invention.

FIG. 1A shows the configuration of a longitudinally-coupled resonator surface acoustic wave (SAW) filter 101 (hereinafter referred to as the filter 101), which is an example of an EGSM-Rx filter, according to a first preferred embodiment of the present invention. Incidentally, the EGSM-Rx filter will be exemplified in second to seventh preferred embodiments described herein.

The filter 101 preferably includes a 40±5° Y-cut X-propagating LiTaO$_3$ substrate 100 (hereinafter referred to as the substrate 100), which is a piezoelectric substrate, ground terminals 204, signal terminals 205, an IDT 102, an IDT 103, and an IDT 104, each having a plurality of electrode fingers preferably made of aluminum and connected to the ground terminals 204 and a plurality of electrode fingers preferably made of aluminum and connected to the signal terminals 205, a reflector 105, and a reflector 106.

The electrode fingers of the IDTs 102 and 104 connected to the ground terminals 204 are opposite to the electrode fingers thereof connected to the signal terminals 205. The reflectors 105 and 106 are disposed so as to sandwich the IDTs 102, 103, and 104 therebetween. The IDTs 102 and 104 are connected in parallel to the same signal terminal 205.

As shown in the same drawing, the pitch of the several electrode fingers of the adjacent portions of IDTs 102 and 103, and the pitch of the several electrode fingers of the adjacent portions of IDTs 103 and 104 are narrower than that of the electrode fingers of the other portions of the IDTs. These electrode fingers with narrower pitch are called narrow-pitch electrode fingers. It should be noted that, in FIG. 1A, the number of electrode fingers is reduced for simplification.

Figure 1B:
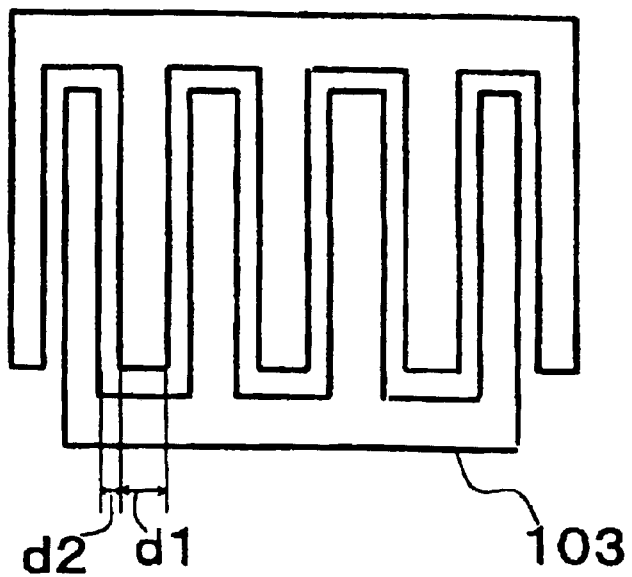
FIG. 1B illustrates the metallization ratio of the longitudinally-coupled resonator SAW filter of FIG. 1A.

In the filter 101, the metallization ratio of the IDTs is varied. The metallization ratio can be expressed by the equation:

$$d = d1/(d1+d2),$$

wherein the width of the electrode finger is indicated as d1 and the width of a gap between the electrode fingers is indicated as d2 as shown in FIG. 1B.

Figure 2:
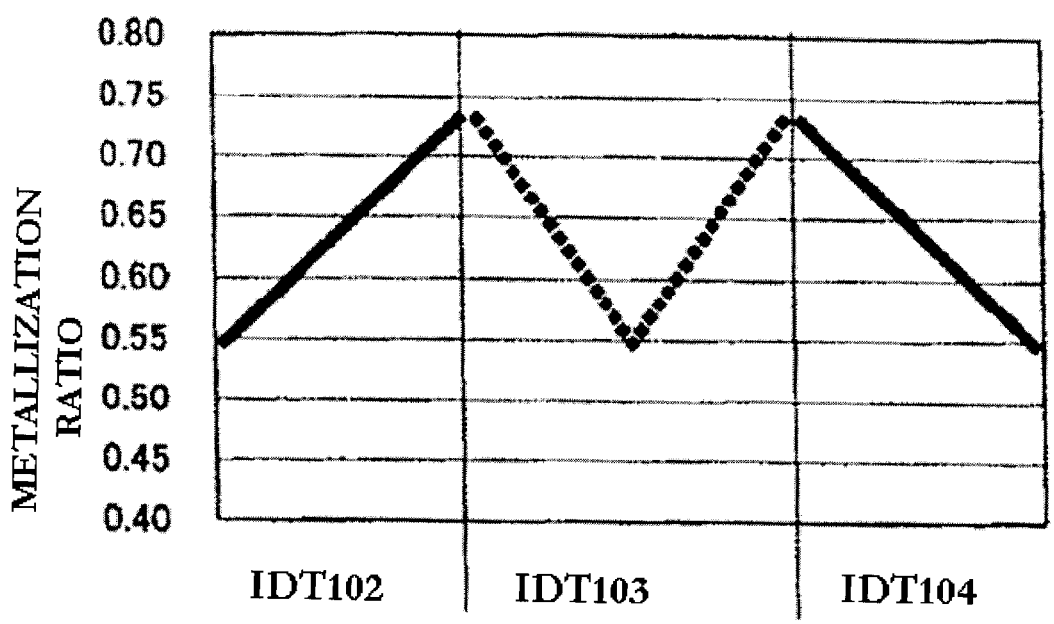
FIG. 2 shows a graph illustrating the variation of the metallization ratio of IDTs of the longitudinally-coupled resonator SAW filter according to the first preferred embodiment of the present invention.

FIG. 2 shows a graph showing the metallization ratio of the IDTs 102, 103, and 104, which continuously varies from about 0.54 to about 0.73. More specifically, the metallization ratio of the IDT 102 continuously varies from about 0.54 to about 0.73 in the direction from the left to the right. For the IDT 103, the metallization ratio thereof continuously varies from about 0.73 to about 0.54 along the direction from the left to the center, and further varies from about 0.54 to about 0.73 along the direction from the center to the right. For the IDT 104, the metallization ratio thereof continuously varies from about 0.73 to about 0.54 along the direction from the left to the right.

When the wavelength of the filter 101 that is determined by the pitch of the narrow-pitch electrode fingers is $\lambda_{I2}$, and when the wavelength thereof that is determined by the pitch of the other electrode fingers is $\lambda_{I1}$, the configuration of the filter 101 can be shown as described below:

Interdigital width W: 47.7$\lambda_{I1}$

Number of electrode fingers of the IDT 102: 27 (four electrode fingers on the right-side thereof are narrow-pitch electrode fingers)

Number of electrode fingers of the IDT 103: 35 (four electrode fingers on the right-side thereof and four electrode fingers on the left-side thereof are narrow-pitch electrode fingers)

Number of electrode fingers of the IDT 104: 27 (four electrode fingers on the left-side thereof are narrow-pitch electrode fingers)

IDT wavelength $\lambda_{I1}$: 4.19 μm, $\lambda_{I2}$: 3.86 μm

Wavelength $\lambda_R$ of the reflectors 105 and 106: 4.26 μm

Number of reflectors 105 and 106: 120

Gap between IDTs (109 and 110 in FIG. 1A): 0.50$\lambda_{I2}$

Gap between IDTs and reflectors: 0.52$\lambda_R$

Metallization ratio of the reflectors: 0.55

Film thickness of the electrodes: 0.08$\lambda_{I1}$

Figure 3:
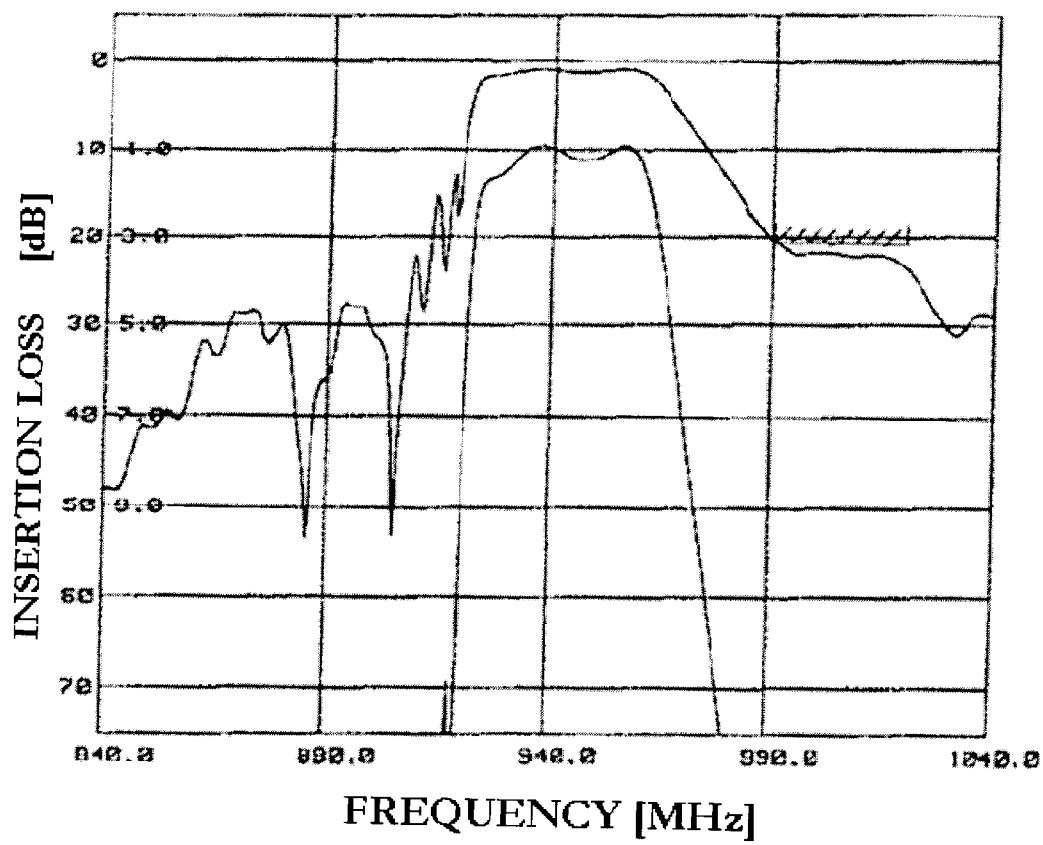
FIG. 3 shows a graph illustrating the frequency-amplitude characteristic of the longitudinally-coupled resonator SAW filter according to the first preferred embodiment of the present invention.
Figure 4:
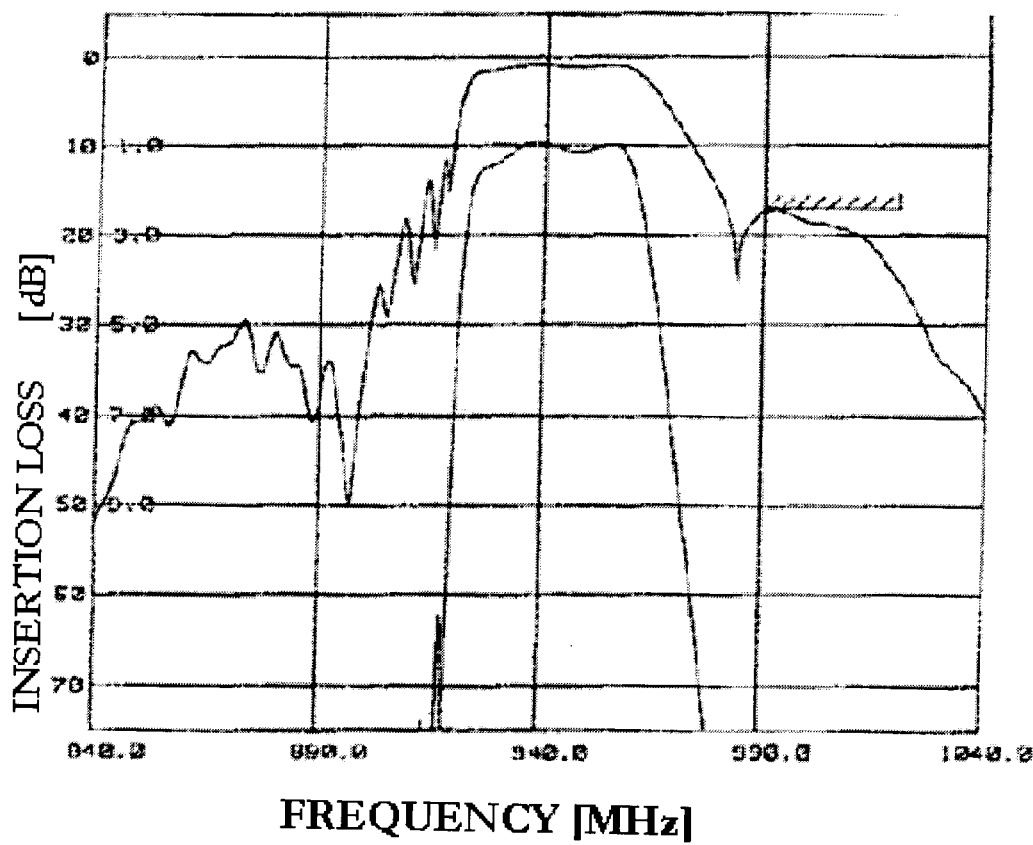
FIG. 4 shows a graph illustrating the frequency-amplitude characteristic of a longitudinally-coupled resonator SAW filter having a known configuration.

FIG. 3 shows the frequency-amplitude characteristic of the filter 101 according to the first preferred embodiment of the present invention. For comparison purposes, FIG. 4 shows the frequency-amplitude characteristic of a longitudinally-coupled resonator SAW filter having a known configuration, whose IDT metallization ratio is preferably constant at about 0.73. The configuration of this known longitudinally-coupled resonator SAW filter is the same as that of the filter 101. However, to perform impedance matching, the interdigital width is changed from about 47.7$\lambda_{I1}$ to about 35.8$\lambda_{I1}$.

As shown in FIG. 3, the attenuation at the higher frequency than the passband, that is, from about 990 MHz to about 1020 MHz (the diagonally shaded area), is improved by about 4 dB in comparison with FIG. 4, since the transversal response is reduced because the metallization ratio of the electrode fingers is continuously varied in the direction along which a SAW is propagated. Further, the width of the passband from the through level to about 4 dB becomes wider, by as much as about 0.5 MHz, than in the case of the known filter. Accordingly, a longitudinally-coupled resonator SAW filter having a reduced transversal response and an improved attenuation at the higher frequency-side of the passband can be obtained.

In the first preferred embodiment, the metallization ratio of all of the IDTs 102, 103, and 104 is continuously varied. However, the same effect as in the first preferred embodiment can be obtained when the metallization ratio of only some of the IDTs is varied.

Figure 5:
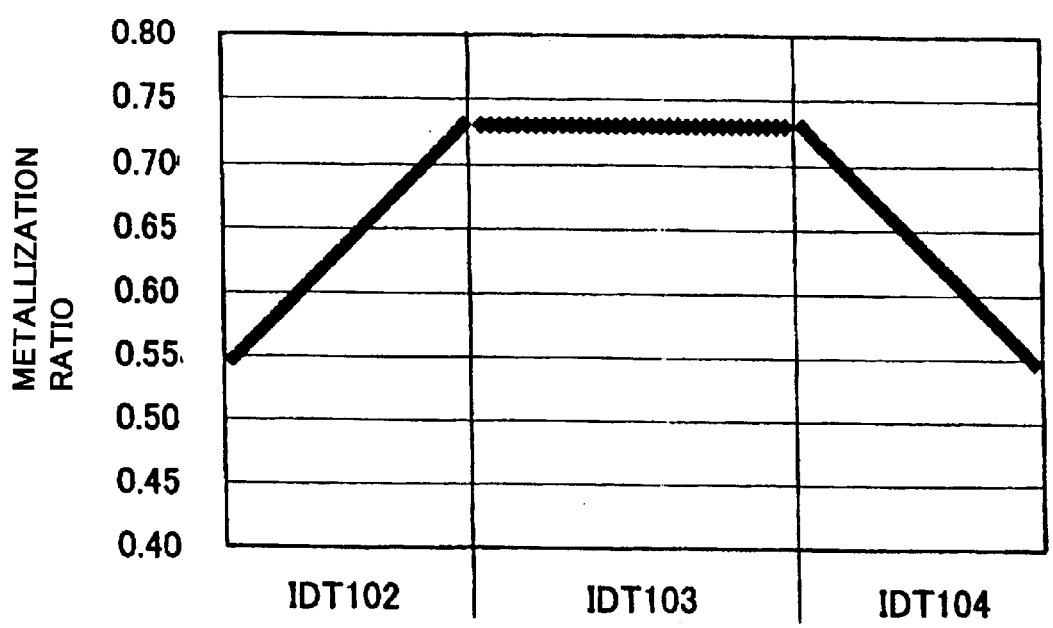
FIG. 5 shows a graph illustrating the variation of the metallization ratio of IDTs of a longitudinally-coupled resonator SAW filter according to a second preferred embodiment of the present invention.

FIG. 5 is a graph showing the variation of the IDTs of a longitudinally-coupled resonator SAW filter according to a second preferred embodiment of the present invention.

In the second preferred embodiment, the metallization ratio of the IDT 103 is not varied while the metallization of the IDTs 102 and 104 is continuously varied. More specifically, the metallization ratio of the electrode fingers of the IDT 102 is continuously varied from about 0.54 to about 0.73 from the left to the right. The metallization ratio of the electrode fingers of the IDT 104 is continuously varied from about 0.73 to about 0.54 from the left to the right. The metallization ratio of the IDT 103 is preferably constant at about 0.73. The configuration of the filter is preferably the same as in the case of the first preferred embodiment except the way the metallization ratio is varied and the fact that the interdigital width between the IDTs is preferably about $40.5\lambda_{I1}$.

Figure 6:
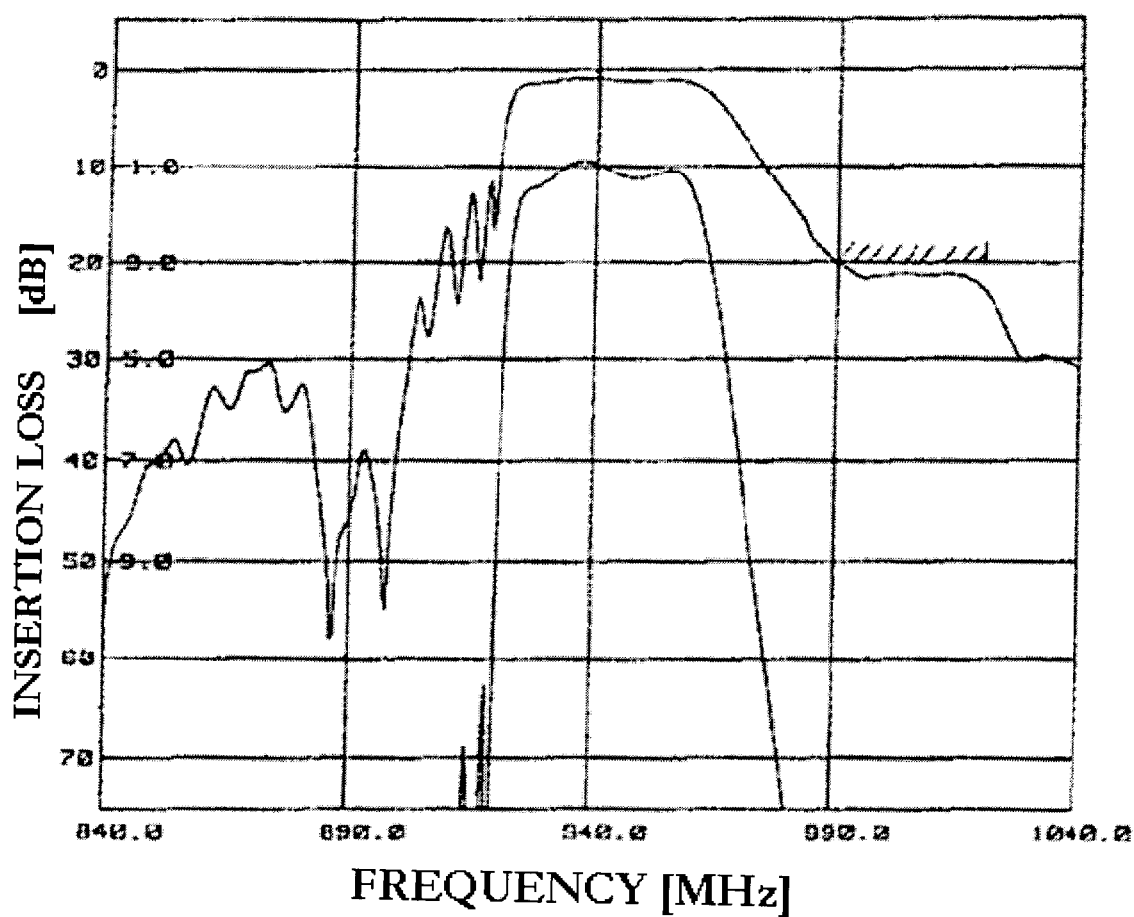
FIG. 6 shows a graph illustrating the frequency-amplitude characteristic of the longitudinally-coupled resonator SAW filter according to the second preferred embodiment of the present invention.

FIG. 6 shows the frequency-amplitude characteristic of the filter according to the second preferred embodiment of the present invention. The attenuation at the higher frequency-side of the passband, that is, from about 990 MHz to about 1020 MHz (the diagonally shaded area) is improved and the width of the passband from the through level to about 4 dB becomes wider by as much as about 2 MHz than in the case of the known filter. Thus, according to the second preferred embodiment where the metallization ratio of some of the IDTs is varied, the same effect as in the case of the first preferred embodiment can be obtained.

In the first and second preferred embodiments, the metallization ratio of the electrode fingers is continuously varied. However, when the metallization is varied, not in a continuous manner, the same effect as in the cases of the first and second preferred embodiments can be obtained.

Figure 7:
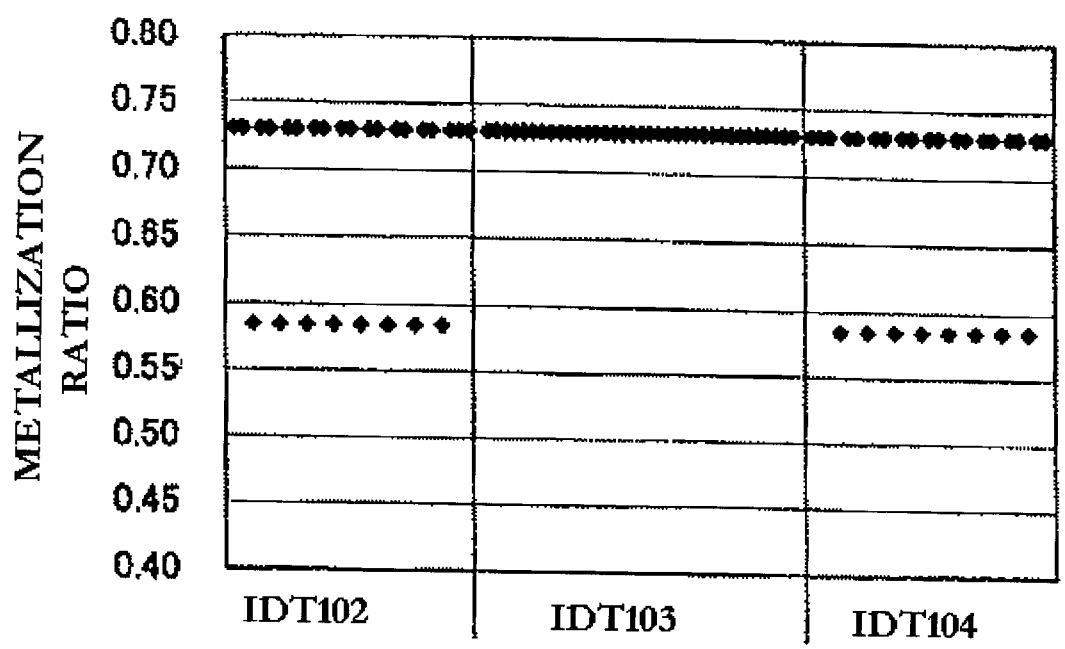
FIG. 7 shows a graph illustrating the variation of the metallization ratio of IDTs of a longitudinally-coupled resonator SAW filter according to a third preferred embodiment of the present invention.

FIG. 7 shows a graph illustrating the variation of the metallization ratio of the IDTs of a longitudinally-coupled resonator SAW filter according to a third preferred embodiment where the metallization ratio of the electrode fingers is non-continuously varied. More specifically, though the basic metallization ratio of the IDTs 102 and 104 is preferably about 0.73, the metallization ratio falls to about 0.584 at intervals of two. The metallization of the IDT 103 is preferably constant at about 0.73. The configuration of the filter is the same as in the cases of the first and second preferred embodiments except the way the metallization ratio is varied and the fact that the interdigital width between the IDTs is preferably about $40.5\lambda_{I1}$.

Figure 8:
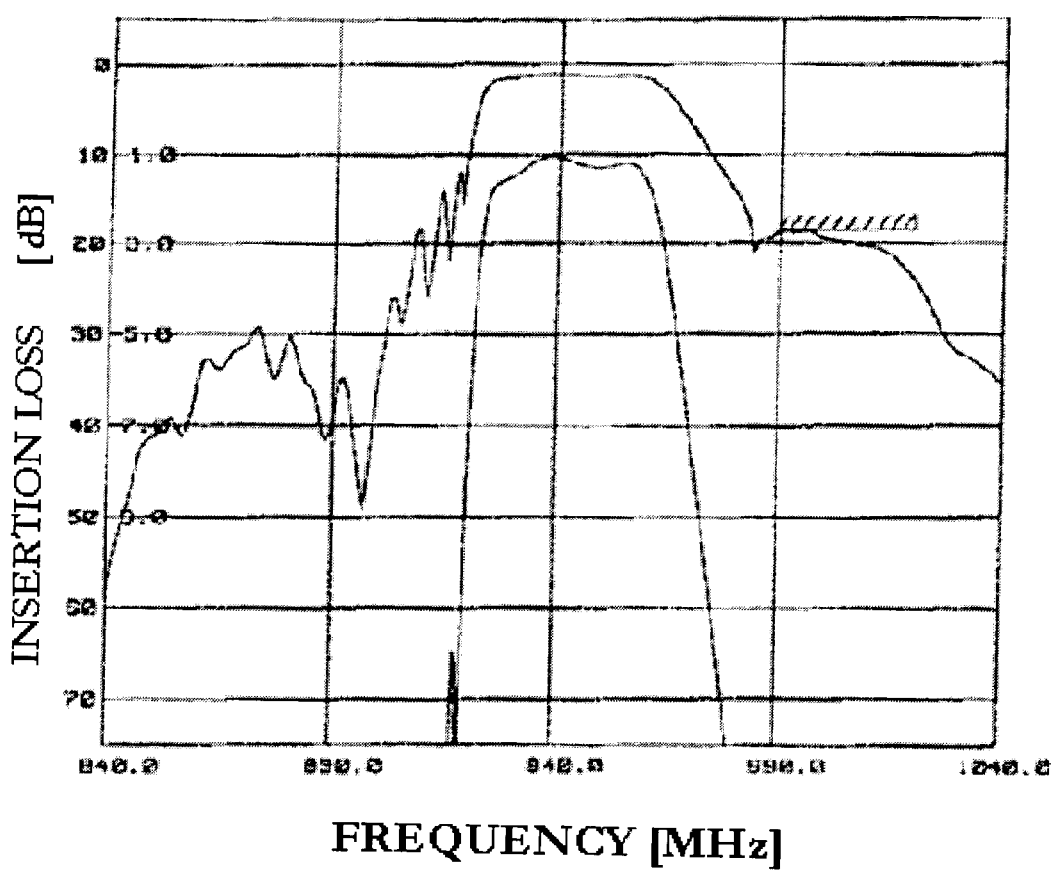
FIG. 8 shows a graph illustrating the frequency-amplitude characteristic of the longitudinally-coupled resonator SAW filter according to the third preferred embodiment of the present invention.

FIG. 8 shows the frequency-amplitude characteristic of the longitudinally-coupled resonator SAW filter according to the third preferred embodiment. The filter according to this preferred embodiment is not effective as much as the filters according to the first and second preferred embodiments. However, the attenuation thereof at the higher frequency-side of the passband, that is, from about 990 MHz to about 1020 MHz (the diagonally shaded area) is improved in comparison with the known case.

Thus, the longitudinally-coupled resonator SAW filter according to the third preferred embodiment has reduced transversal response and an improved attenuation at the higher frequency-side of the passband, since the metallization ratio of the electrode fingers is non-continuously varied. When the metallization ratio is non-continuously varied, the IDTs also become non-continuous, and the insertion loss in the passband grows larger. Therefore, it is preferable to vary the metallization ratio continuously as in the first and second preferred embodiments of the present invention.

In the first to third preferred embodiments of the present invention, the metallization ratio of all of the electrode fingers is preferably varied. However, by forming a portion wherein the metallization ratio of the electrode fingers is changed in an area from the adjacent portion of the IDT to an about one-fourth portion of the IDT, the transversal response is reduced and the attenuation at the higher frequency-side of the passband becomes larger.

In the first to third preferred embodiments, the 40±5° Y-cut X-propagating LiTaO$_3$ substrate is preferably used. However, a 64 to 72° Y-cut X-propagating LiNbO$_3$ substrate, or a 41° Y-cut X-propagating LiNbO$_3$ substrate may be used to obtain the same effect as in the above-described preferred embodiments. Further, the longitudinally-coupled resonator SAW filter of various preferred embodiments of the present invention preferably has three IDTs. However, the filter may be configured otherwise to obtain the same effect as in the above-described preferred embodiments. For example, the filter may have two IDTs, or may have four or more IDTs to obtain the same effect as in the above-described preferred embodiments. Further, the same effect can be obtained when two filters of the present invention are connected in series. Further, one-terminal pair SAW resonators may be connected in series or in parallel.

The longitudinally-coupled resonator SAW filter shown in the first to third preferred embodiments may be used for a longitudinally-coupled resonator SAW filter having a function of balanced/unbalanced conversion of a signal. Accordingly, a longitudinally-coupled resonator SAW filter having the function of balance/unbalance signal conversion and the large attenuation at the higher frequency-side of the passband can be obtained.

FIGS. 9 to 12 show the configuration of the longitudinally-coupled resonator SAW filter of another preferred embodiment of the present invention having the function of balance/unbalance signal conversion.

Figure 9:
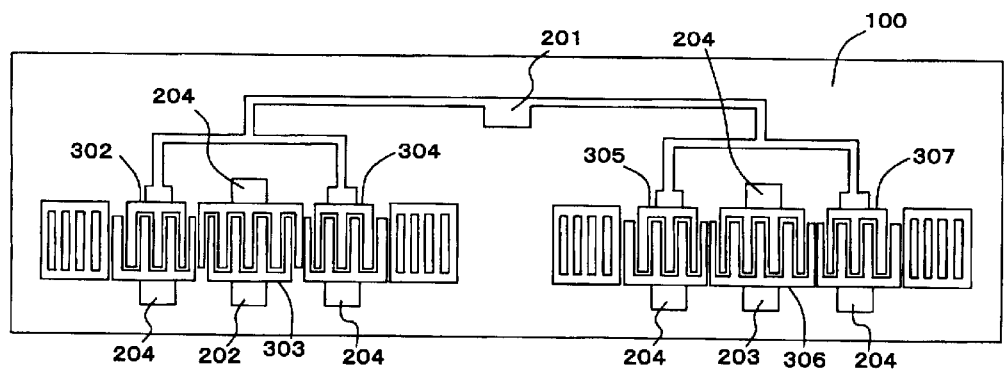
FIG. 9 schematically shows a longitudinally-coupled resonator SAW filter according to a fourth preferred embodiment of the present invention.

FIG. 9 shows a longitudinally-coupled resonator SAW filter 301 having the function of balance/unbalance signal conversion according to a fourth preferred embodiment of the present invention. The filter 301 preferably includes two longitudinally-coupled resonator SAW filters, which are configured substantially the same as the filter 101 in the first preferred embodiment shown in FIG. 1A and which are connected in parallel. The filter 301 is different from the filter 101 wherein the IDT 306 of the three IDTs (305, 306, and 307 from the left) on the right side is disposed top side down. In the filter 301, one of opposing groups of electrode fingers of the IDTs 302, 304, 305, and 307 is connected to an unbalanced terminal 201, one of opposing groups of electrode fingers of an IDT 303 is connected to a balanced terminal 202, and one of opposing groups of electrode fingers of the IDT 306 is connected to a balanced terminal 203.

Figure 10:
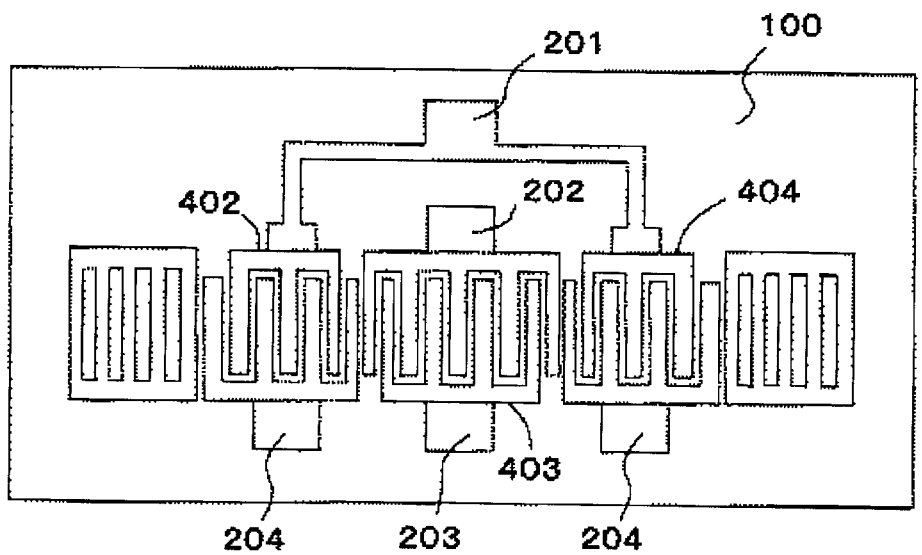
FIG. 10 schematically shows a longitudinally-coupled resonator SAW filter according to a fifth preferred embodiment of the present invention.

FIG. 10 shows a longitudinally-coupled resonator SAW filter 401 having the function of balance/unbalance signal conversion according to a fifth preferred embodiment of the present invention. The filter 401 is preferably configured substantially the same as the filter 101 in the first preferred embodiment, and has a unique characteristic in the way that the electrode fingers of an IDT 403 of three IDTs (402, 403, and 404 from the left) are connected to the balanced terminals and to the unbalanced terminal. That is to say, one of opposing groups of electrode fingers of the IDT 403 is connected to the balanced terminal 202, and the other group is connected to the balanced terminal 203. Further, one of opposing groups of electrode fingers of IDTs 402 and 404 is connected to the unbalanced terminal 201.

Figure 11:
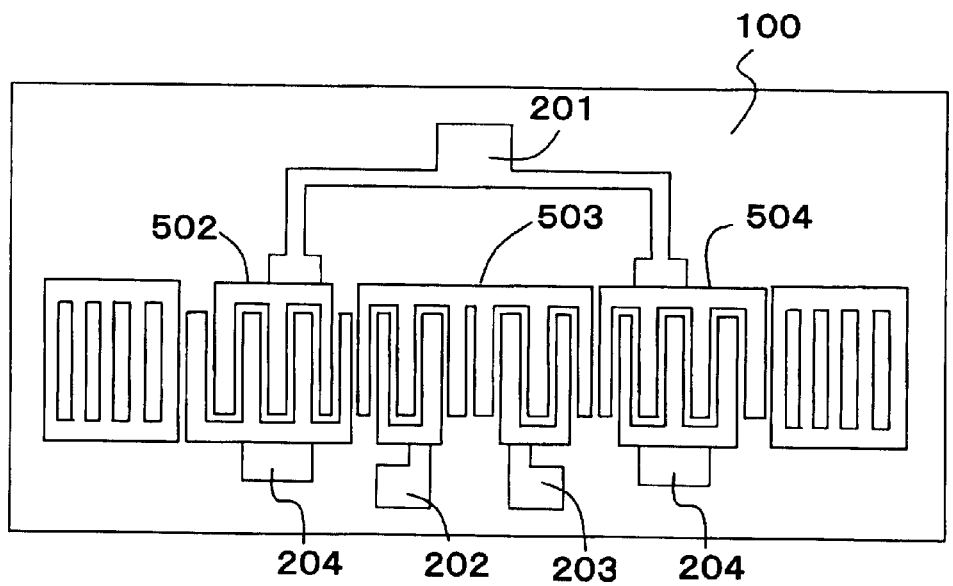
FIG. 11 schematically shows a longitudinally-coupled resonator SAW filter according to a sixth preferred embodiment of the present invention.

FIG. 11 shows a longitudinally-coupled resonator SAW filter 501 having the function of balance/unbalance signal conversion according to a sixth preferred embodiment of the present invention. The basic configuration of the filter 501 is the same as that of the filter 101 of the first preferred embodiment. However, the filter 501 is different from the filter 101 wherein an IDT 504 of three IDTs (502, 503, and 504 from the left) is disposed top side down, and electrodes near the center of the IDT 503 are reversed so that the adjacent electrodes are disposed in the same direction. In the filter 501, one of opposing groups of electrode fingers of IDTs 502 and 504 is connected to the unbalanced terminal 201, and one of opposing groups of electrode fingers of IDT 503, the group on the left of the reversed electrodes, is connected to the balanced terminal 202. Further, the other group of electrode fingers of IDT 503, the group on the right of the reversed electrodes, is connected to the balanced terminal 203.

Figure 12:
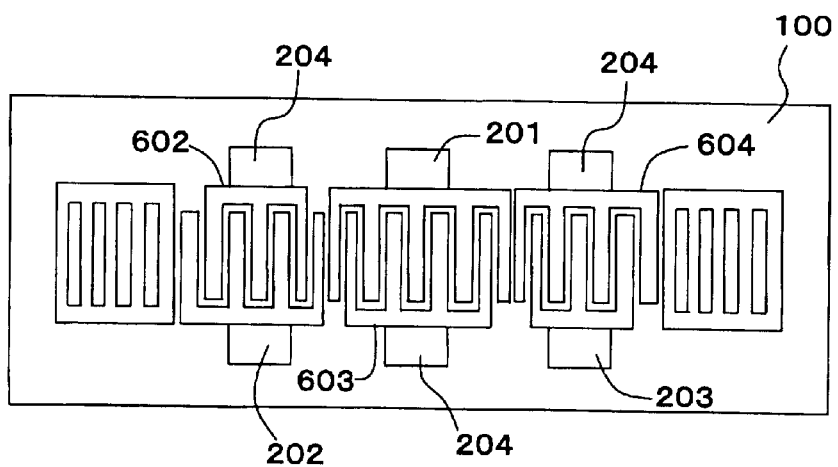
FIG. 12 schematically shows a longitudinally-coupled resonator SAW filter according to a seventh preferred embodiment of the present invention.

FIG. 12 shows a longitudinally-coupled resonator SAW filter 601 having the function of balance/unbalance signal conversion according to a seventh preferred embodiment. The basic configuration of the filter 601 is preferably the same as that of the filter 101 of the first preferred embodiment. However, the filter 601 is different from the filter 101 wherein an IDT 604 of three IDTs (602, 603, and 604 from the left) is disposed top side down. In the filter 601, one of opposing groups of electrode fingers of the IDT 602 is connected to the balanced terminal 202. Further, one of opposing groups of electrode fingers of the IDT 604 is connected to the balanced terminal 203, and one of opposing groups of electrode fingers of the IDT 603 is connected to the unbalanced terminal 201.

As has been described from the fourth to seventh preferred embodiments, the longitudinally-coupled resonator SAW filter includes the function of balance/unbalance signal conversion. Accordingly, a longitudinally-coupled resonator SAW filter that has the function of balance/unbalance signal conversion and that achieves large attenuation at the higher frequency-side of the passband can be obtained.

Figure 13:
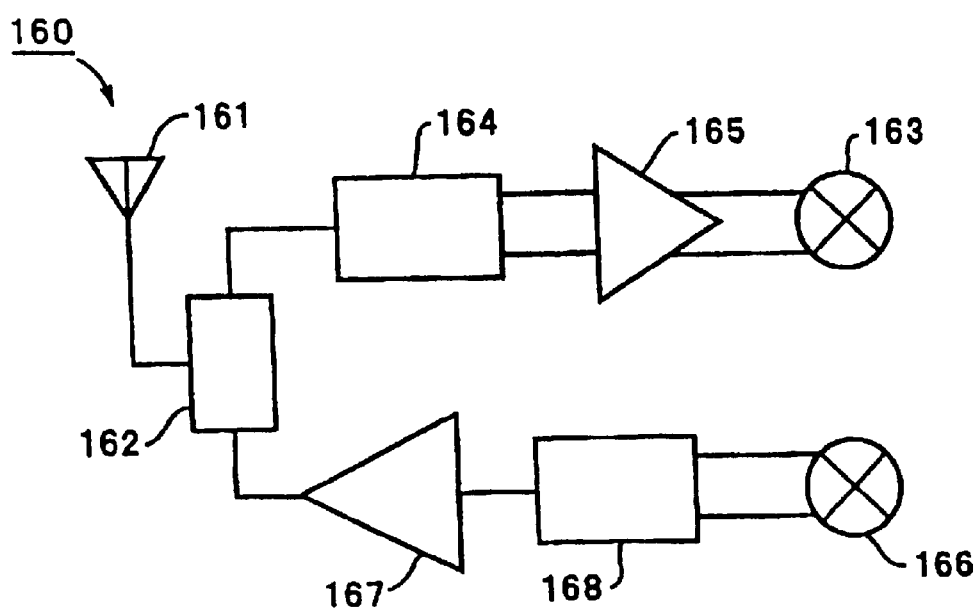
FIG. 13 is a block diagram schematically showing a communication apparatus having the longitudinally-coupled resonator SAW filter according to preferred embodiments of the present invention mounted therein.

FIG. 13 shows a block diagram schematically illustrating a communication apparatus 160 having the longitudinally-coupled resonator SAW filter according to various preferred embodiments of the present invention mounted therein.

In FIG. 13, a duplexer 162 is connected to an antenna 161. A longitudinally-coupled resonator SAW filter 164 and an amplifier 165 are connected between the duplexer 162 and a receiving mixer 163. Further, an amplifier 167 and a longitudinally-coupled resonator SAW filter 168 are connected between the duplexer 162 and a transmitting mixer 166. When the amplifier 165 can handle a balanced signal as in this example, a communication apparatus having suitable communication quality and high reliability can be obtained by using the longitudinally-coupled resonator SAW filter according to preferred embodiments of the present invention can be used as the filter 164.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally-coupled resonator surface acoustic wave (SAW) filter comprising:
   a piezoelectric substrate; and
   at least two interdigital transducers (IDTs) provided on the piezoelectric substrate along the direction in which a surface acoustic wave propagates; wherein
   at least one of the IDTs has an electrode finger with a metallization ratio that is different from that of other electrode fingers of the IDT.

2. A longitudinally-coupled resonator SAW filter according to claim 1, wherein at least one of adjacent IDTs has an electrode finger at a region extending from the adjacent portion of the IDT to an about one-fourth portion of the IDT wherein the metallization ratio of the electrode finger is different from that of other electrode finger of the IDT.

3. A longitudinally-coupled resonator SAW filter according to claim 1, wherein at least one of the IDTs has electrode fingers wherein the metallization ratio of the electrode fingers is continuously varied in the direction along which a surface acoustic wave propagates.

4. A longitudinally-coupled resonator SAW filter according to claim 1, wherein the SAW filter is an EGSM-Rx filter.

5. A longitudinally-coupled resonator SAW filter according to claim 1, wherein the piezoelectric substrate is a 40±5° Y-cut X-propagating $LiTaO_3$ substrate.

6. A longitudinally-coupled resonator SAW filter according to claim 1, further comprising reflectors disposed at opposite ends of the piezoelectric substrate.

7. A longitudinally-coupled resonator SAW filter according to claim 1, wherein the at least two IDTs include electrode fingers and portions which are adjacent to each other, and the pitch of the electrode fingers of the adjacent portions of at least two IDTs are narrower than that of the electrode fingers of the other portions of the at least two IDTs.

8. A longitudinally-coupled resonator SAW filter according to claim 1, wherein at least one of the at least two IDTs has electrode fingers wherein the metallization ratio of the electrode fingers is continuously varied from about 0.54 to about 0.73.

9. A longitudinally-coupled resonator SAW filter according to claim 1, wherein the at least two IDTs have electrode fingers, and the electrode fingers of one of the at least two IDTs has a metallization ratio that is continuously varied from about 0.54 to about 0.73 in a direction along which a surface acoustic wave propagates and the electrode fingers of a second of the at least two IDTs has a constant metallization ratio.

10. A longitudinally-coupled resonator SAW filter according to claim 9, wherein the constant metallization ratio is about 0.73.

11. A longitudinally-coupled resonator SAW filter according to claim 1, wherein the at least two IDTs have electrode fingers, and the electrode fingers of one of the at least two IDTs has a metallization ratio that is continuously varied from about 0.54 to about 0.73 in a direction along which a surface acoustic wave propagates and the electrode fingers of a second of the at least two IDTs has a metallization ratio that is continuously varied from about 0.73 to about 0.54 in the direction along which a surface acoustic wave propagates.

12. A longitudinally-coupled resonator SAW filter according to claim 1, wherein at least one of the at least two IDTs has electrode fingers wherein the metallization ratio of the electrode fingers is non-continuously varied.

13. A longitudinally-coupled resonator SAW filter according to claim 1, wherein the at least two IDTs have electrode fingers, and the electrode fingers of one of the at least two IDTs has a metallization ratio that is non-continuously varied in a direction along which a surface acoustic wave propagates and the electrode fingers of a second of the at least two IDTs has a constant metallization ratio.

14. A longitudinally-coupled resonator SAW filter according to claim 13, wherein the constant metallization ratio is about 0.73.

15. A longitudinally-coupled resonator SAW filter according to claim 1, wherein the at least two IDTs have electrode fingers, and the electrode fingers of one of the at least two IDTs has a metallization ratio that is non-continuously varied from about 0.73 to about 0.584 in a direction along which a surface acoustic wave propagates.

16. A longitudinally-coupled resonator SAW filter according to claim 1, wherein the interdigital width between the IDTs is about 35.8 times the wavelength of a surface acoustic wave propagated in the SAW filter.

17. A longitudinally-coupled resonator SAW filter according to claim 1, wherein the interdigital width between the IDTs is about 40.5 the wavelength of a surface acoustic wave propagated in the SAW filter.

18. A longitudinally-coupled resonator SAW filter according to claim 1, wherein the piezoelectric substrate is one of a 40±5° Y-cut X-propagating $LiTaO_3$ substrate, a 64 to 72° Y-cut X-propagating $LiNbO_3$ substrate, and a 41° Y-cut X-propagating $LiNbO_3$ substrate.

19. A longitudinally-coupled resonator SAW filter according to claim 1, wherein the SAW filter has a balance/unbalance signal conversion function.

20. A communication apparatus comprising a longitudinally-coupled resonator SAW filter according to claim 1 mounted therein.

* * * * *